(12) United States Patent
Bharadwaj

(10) Patent No.: US 10,779,421 B1
(45) Date of Patent: Sep. 15, 2020

(54) ACTIVE ELECTRO-MECHANICAL MATERIALS FOR PROTECTING PORTABLE ELECTRONIC DEVICES

(71) Applicant: Apple Inc., Cupertino, CA (US)

(72) Inventor: Shravan Bharadwaj, San Jose, CA (US)

(73) Assignee: APPLE INC., Cupertino, CA (US)

( * ) Notice: Subject to any disclaimer, the term of this patent is extended or adjusted under 35 U.S.C. 154(b) by 0 days.

(21) Appl. No.: 16/434,628

(22) Filed: Jun. 7, 2019

Related U.S. Application Data

(60) Provisional application No. 62/802,340, filed on Feb. 7, 2019.

(51) Int. Cl.
| | | |
|---|---|---|
| *H05K 5/00* | (2006.01) | |
| *H01F 1/44* | (2006.01) | |
| *H05K 5/02* | (2006.01) | |
| *H01F 1/153* | (2006.01) | |
| *B65D 81/02* | (2006.01) | |

(52) U.S. Cl.
CPC ....... *H05K 5/0086* (2013.01); *H01F 1/15391* (2013.01); *H01F 1/447* (2013.01); *H05K 5/0247* (2013.01); *B65D 81/022* (2013.01)

(58) Field of Classification Search
CPC ............... H05K 5/0086; H05K 5/0247; H01F 1/15391; H01F 1/447; B65D 81/022; H04M 1/185; H04M 2250/12; H04M 1/0202; G06F 1/1656; G06F 1/1626; G06F 2200/1633; G06F 1/1694; H04B 1/3888; A45C 13/002

See application file for complete search history.

(56) References Cited

U.S. PATENT DOCUMENTS

| | | | | |
|---|---|---|---|---|
| 8,330,305 | B2 * | 12/2012 | Hart | H04M 1/185 |
| | | | | 307/650 |
| 2013/0027202 | A1 * | 1/2013 | Lai | G06F 1/1656 |
| | | | | 340/540 |
| 2013/0073095 | A1 * | 3/2013 | King | H04M 1/185 |
| | | | | 700/279 |
| 2016/0141085 | A1 | 5/2016 | Heino et al. | |
| 2017/0047960 | A1 * | 2/2017 | Kil | H04W 4/80 |
| 2017/0111076 | A1 * | 4/2017 | Choi | H04B 1/3888 |
| 2017/0228022 | A1 | 8/2017 | Shimanouchi | |
| 2018/0240758 | A1 | 8/2018 | Okamoto et al. | |
| 2018/0295731 | A1 * | 10/2018 | Burdoucci | H04M 1/00 |
| 2019/0249746 | A1 * | 8/2019 | Saley | G08B 21/0446 |

* cited by examiner

*Primary Examiner* — Abhishek M Rathod
(74) *Attorney, Agent, or Firm* — Dickinson Wright RLLP

(57) ABSTRACT

This application relates to a case for a portable electronic device. The case includes a housing having walls that define a cavity, where the walls are capable of carrying the portable electronic device within the cavity. The walls carry operational components that include a processor capable of providing instructions, a magnetic circuit capable of generating a magnetic field in response to receiving the instructions from the processor, and a magnetosensitive layer that includes (i) a matrix, and (ii) magnetic particles interspersed within the matrix according to a first distribution, where when the magnetosensitive layer is exposed to the magnetic field, the magnetic particles are rearranged according to a second distribution.

19 Claims, 12 Drawing Sheets

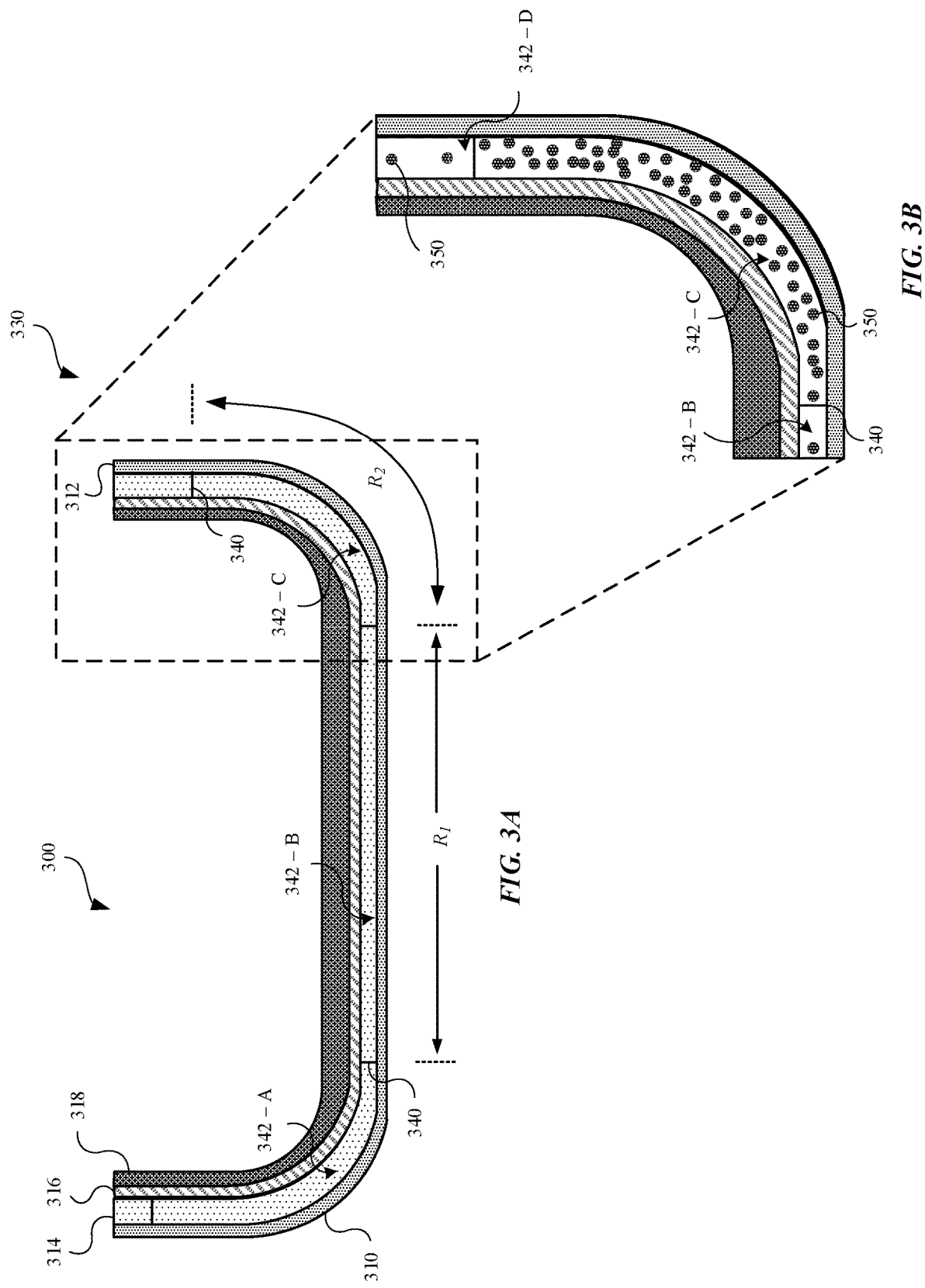

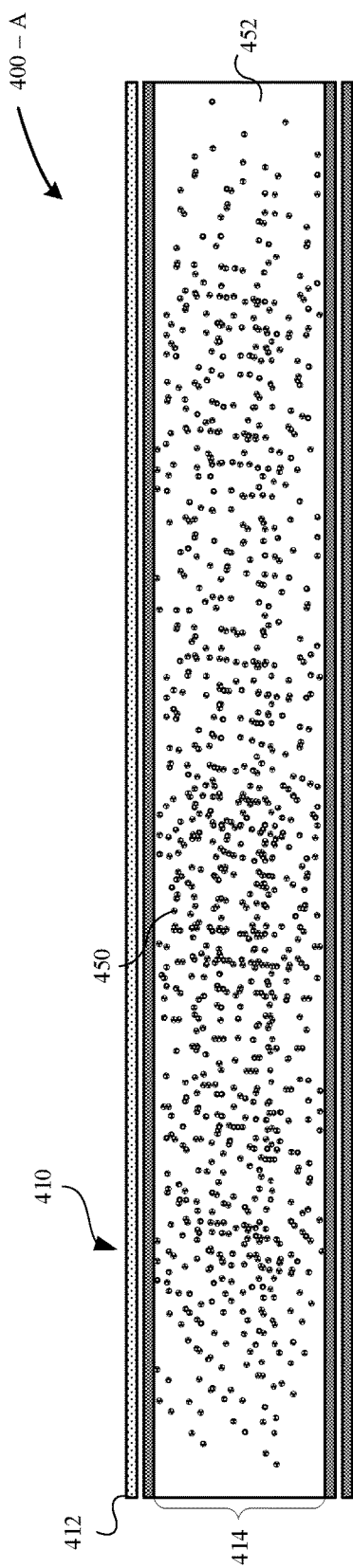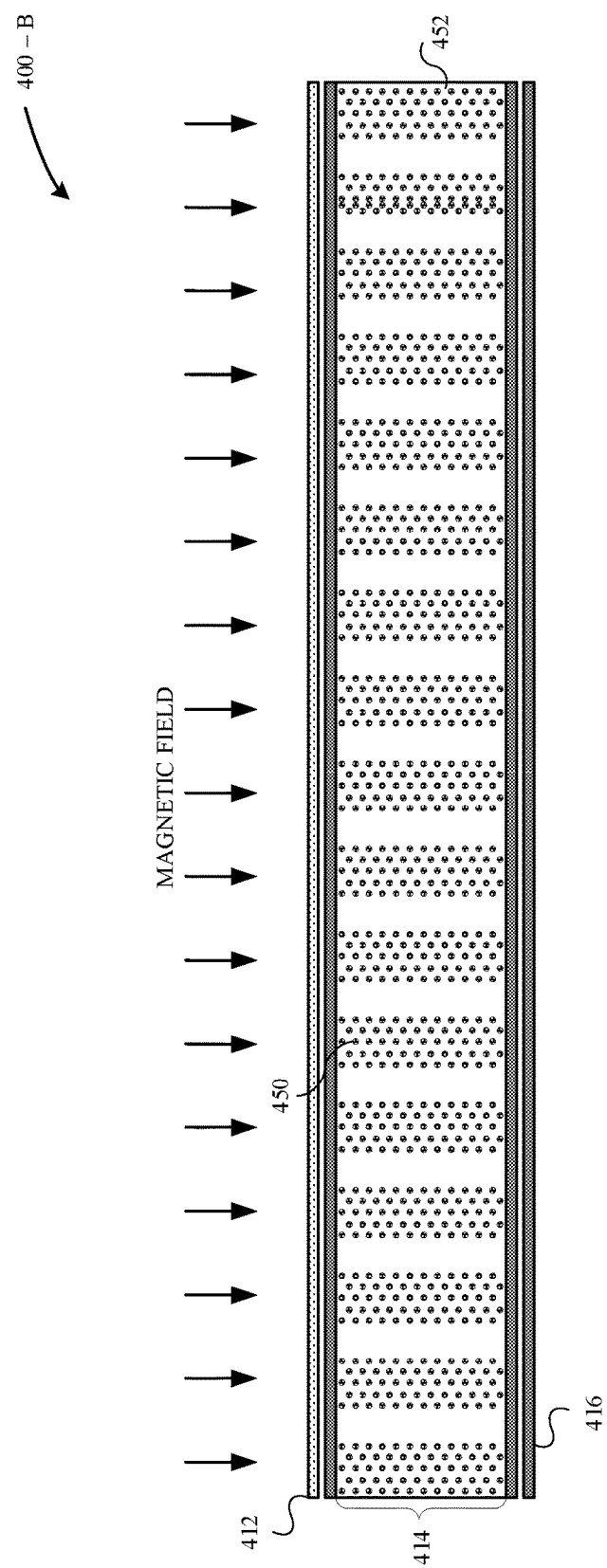
FIG. 4A
FIG. 4B

ACTIVE ELECTRO-MECHANICAL MATERIALS FOR PROTECTING PORTABLE ELECTRONIC DEVICES

CROSS-REFERENCE TO RELATED APPLICATIONS

The present application claims the benefit of U.S. Provisional Application No. 62/802,340, entitled "ACTIVE ELECTRO-MECHANICAL MATERIALS FOR PROTECTING PORTABLE ELECTRONIC DEVICES," filed Feb. 7, 2019, the content of which is incorporated herein by reference in its entirety for all purposes.

FIELD

The described embodiments relate generally to active electro-mechanical materials for protecting portable electronic devices. More particularly, the present embodiments relate to active magnetorheological or electro-active polymers that are capable of protecting portable electronic devices during a drop event.

BACKGROUND

Portable electronic devices may be manufactured from a variety of different materials, including glass, aluminum, stainless steel, and the like. These portable electronic devices may be carried by protective cases to protect the portable electronic devices from shock caused by a drop event. Although recent technological advances have led manufacturers of protective cases to incorporate a variety of different protective materials to protect these portable electronic devices, these different materials are insufficient to fully protect the portable electronic devices under a variety of different circumstances. Therefore, there is a need to utilize active materials that are capable of adapting to these variety of different circumstances.

SUMMARY

This paper describes various embodiments that relate to active electro-mechanical materials for portable electronic devices. In particular, the various embodiments relate to active magnetorheological or electro-active polymers that are capable of protecting portable electronic devices during a drop event.

According to some embodiments, a case for a portable electronic device is described. The case includes a housing having walls that define a cavity, where the walls are capable of carrying the portable electronic device within the cavity. The walls carry operational components that include a processor capable of providing instructions, a magnetic circuit capable of generating a magnetic field in response to receiving the instructions from the processor, and a magnetosensitive layer that includes (i) a matrix, and (ii) magnetic particles interspersed within the matrix according to a first distribution, where when the magnetosensitive layer is exposed to the magnetic field, the magnetic particles are rearranged according to a second distribution.

According to some embodiments, a system is described. The system includes a portable electronic device that includes a controller capable of (i) determining when the portable electronic device is exposed to a drop event, and (ii) generating a signal that corresponds to the drop event; and a transmitter capable of transmitting the signal. The system further includes a case including walls that define a cavity, where the portable electronic device is capable of being carried within the cavity. The case includes a processor capable of (i) receiving the signal from the portable electronic device, and (ii) in response, generating instructions corresponding to the signal, a conductive circuit capable of generating an electrical field in response to receiving the instructions from the processor, and an electro-active polymer layer, where when the electro-active polymer is stimulated by the electrical field, the electrical field alters a physical characteristic of the electro-active polymer layer such as to protect the portable electronic device during the drop event.

According to some embodiments, a portable electronic device is described. The portable electronic device includes a housing having walls capable of carrying operational components that include an electronic component, a processor capable of providing instructions, and a sensor capable of (i) determining when the portable electronic device is exposed to a drop event, and (ii) generating a signal in accordance with the drop event. The operational components further include a seal that is disposed between at least one of the walls and the electronic component. The seal includes a magnetic circuit capable of (i) receiving the signal from the sensor, and (ii) in response, generating a magnetic field, and a magnetosensitive core that includes magnetic particles distributed throughout a matrix, where when the magnetosensitive core is exposed to the magnetic field, the magnetic field alters the distribution of the magnetic particles within the matrix such as to alter a stiffness of the seal so as to cause a load associated with the drop event to be redirected away from the electronic component.

Other aspects and advantages of the invention will become apparent from the following detailed description taken in conjunction with the accompanying drawings which illustrate, by way of example, the principles of the described embodiments.

This Summary is provided merely for purposes of summarizing some example embodiments so as to provide a basic understanding of some aspects of the subject matter described herein. Accordingly, it will be appreciated that the above-described features are merely examples and should not be construed to narrow the scope or spirit of the subject matter described herein in any way. Other features, aspects, and advantages of the subject matter described herein will become apparent from the following Detailed Description, Figures, and Claims.

BRIEF DESCRIPTION OF THE DRAWINGS

The disclosure will be readily understood by the following detailed description in conjunction with the accompanying drawings, wherein like reference numerals designate like structural elements.

FIGS. 3A-3B illustrate various views of an exemplary case for a portable electronic device that is capable of protecting the portable electronic device according to the techniques described herein, in accordance with some embodiments.

FIGS. 4A-4B illustrate an exemplary sequence diagram of a case for a portable electronic device that is configured to implement aspects of the various techniques described herein, in accordance with some embodiments.

DETAILED DESCRIPTION

Figure 1:
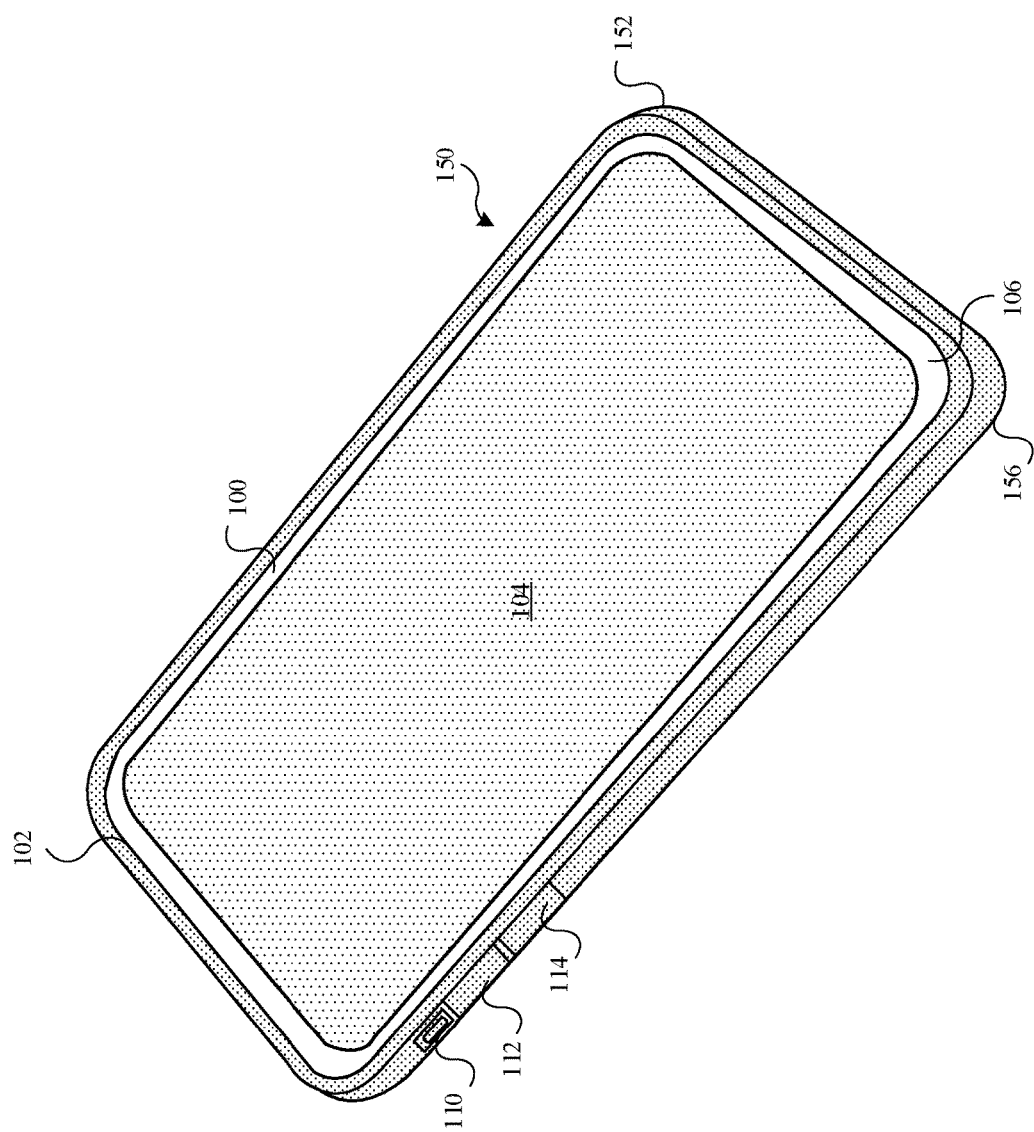
FIG. 1 illustrates a perspective view of an exemplary case for a portable electronic device that is capable of protecting the portable electronic device according to the techniques described herein, in accordance with some embodiments.

Representative applications of methods and apparatus according to the present application are described in this section. These examples are being provided solely to add context and aid in the understanding of the described embodiments. It will thus be apparent to one skilled in the art that the described embodiments may be practiced without some or all of these specific details. In other instances, well known process steps have not been described in detail in order to avoid unnecessarily obscuring the described embodiments. Other applications are possible, such that the following examples should not be taken as limiting.

In the following detailed description, references are made to the accompanying drawings, which form a part of the description and in which are shown, by way of illustration, specific embodiments in accordance with the described embodiments. Although these embodiments are described in sufficient detail to enable one skilled in the art to practice the described embodiments, it is understood that these examples are not limiting; such that other embodiments may be used, and changes may be made without departing from the spirit and scope of the described embodiments.

The embodiments described herein relate generally to active electro-mechanical materials that are capable of protecting portable electronic devices during a drop event.

Portable electronic devices are comprised of a variety of different materials, such as glass, aluminum, and stainless steel. However, these materials by themselves may be insufficient to fully protect electronic components that are carried within the portable electronic device when the portable electronic device is subject to impact, such as during a drop event. Recent technological advances have led manufacturers to incorporate a variety of different passive materials (e.g., plastic, leather, etc.) in protective cases for these portable electronic device. However, passive materials are limited in their ability to fully protect these portable electronic devices in a variety of circumstances. In particular, the passive materials are characterized as having a static damping coefficient. Thus, if the protective case is subject to an impact that exceeds a force threshold, then the passive materials are insufficient to protect the portable electronic device.

To cure the aforementioned deficiencies, the apparatus and techniques described herein relate to utilizing active electro-mechanical materials to protect portable electronic devices from impact, such as caused by a drop event. In some embodiments, the active electro-mechanical materials may be incorporated in protective cases. In some embodiments, the active electro-mechanical materials may be utilized as seals or gaskets while also preventing and/or minimizing moisture and air ingress into the portable electronic devices. In particular, the active electro-mechanical materials may be utilized to adapt an amount of damping (e.g., damping coefficient, etc.) required to sufficiently protect these portable electronic devices.

According to some embodiments, a case for a portable electronic device is described. The case includes a housing having walls that define a cavity, where the walls are capable of carrying the portable electronic device within the cavity. The walls carry operational components that include a processor capable of providing instructions, a magnetic circuit capable of generating a magnetic field in response to receiving the instructions from the processor, and a magnetosensitive layer that includes (i) a matrix, and (ii) magnetic particles interspersed within the matrix according to a first distribution, where when the magnetosensitive layer is exposed to the magnetic field, the magnetic particles are rearranged according to a second distribution.

These and other embodiments are discussed below with reference to FIGS. 1-13; however, those skilled in the art will readily appreciate that the detailed description given herein with respect to these figures is for explanatory purposes only and should not be construed as limiting.

FIG. 1 illustrates an exemplary view of a case for a portable electronic device that is capable of executing the techniques described herein, in accordance with some embodiments. In particular, FIG. 1 illustrates a case 150 that is capable of carrying a portable electronic device 100. The case 150 includes a housing 152 having walls 154 that define a cavity (not illustrated) that is capable of carrying the portable electronic device 100 therein. The walls 154 of the housing 152 may have a shape that is similar to and/or identical to a shape of the portable electronic device 100. Examples of the portable electronic device 100 include phones, tablets, portable computing devices, smart phones, laptops, and the like.

The portable electronic device 100 includes a housing 102 that carry a display 104 that is capable of presenting visual content to a user. The housing 102 includes walls 106 that carry rocker switches 110, 112, and 114. The rocker switches 110, 112, and 114 are capable of providing input signals to the portable electronic device 100. According to some examples, the housing 102 of the portable electronic device 100 is comprised of one or more different materials including metal (e.g., stainless steel, titanium, aluminum, etc.), polymers, and glass.

According to some examples, the housing 152 of the case 150 is comprised of one or more active electro-mechanical materials and one or more passive materials. The housing 152 includes a corner 156. In some examples, the active electro-mechanical materials and the passive materials are characterized as having a damping capability for absorbing impact, such as when the portable electronic device 100 is exposed to a drop event. In particular, the case 150 may be comprised of different types of passive materials, such as silicone, plastic, and leather. As defined herein, passive materials have a static damping coefficient while active electro-mechanical materials have an adjustable damping coefficient. As defined herein, the term "damping coefficient" is a material property that indicates the degree to which a material either bounces back or returns energy when the material comes into contact with a physical object. A material with a low damping coefficient will return a large amount of energy, while a material with a high damping coefficient will return a low amount of energy. Accordingly, materials with a high damping coefficient are stronger at absorbing shock associated with the impact. As described herein, the damping coefficient is given in units of Newton-seconds per meter.

However, because passive materials are associated with a static damping coefficient, these passive materials cannot adjust for differences in magnitude of a drop event. For example, when an amount of force associated with an impact exceeds a damping threshold provided by the passive material, then the portable electronic device 100 and its respective electronic components is likely to become damaged. Accordingly, to adjust for this difference, the case 150 also includes an active electro-mechanical material to adjust the amount of damping provided by the case 150 according to the changing properties of the drop event. The active electro-mechanical material may be non-visible as the active electro-mechanical material is concealed by a cosmetic layer. Unlike the passive material, the active electro-mechanical material has an adjustable damping coefficient. In some examples, the active electro-mechanical material includes magnetorheological elastomers (MRE) or electro-active polymers (EAP). When the active electro-mechanical material is exposed to an external stimuli (e.g., electrical field, magnetic field, etc.), then the active electro-mechanical material is activated. Subsequently, the stiffness or viscosity of the active electro-mechanical material is altered, as will be described in greater detail herein.

Figure 2A:
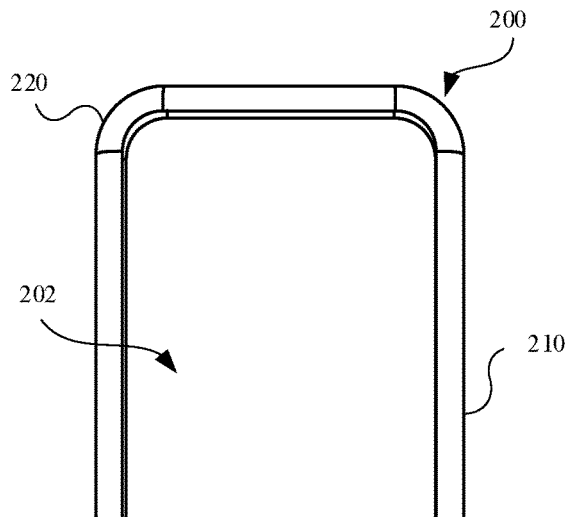
FIGS. 2A-2B illustrate various views of an exemplary case for a portable electronic device that is capable of protecting the portable electronic device according to the techniques described herein, in accordance with some embodiments.
Figure 2B:
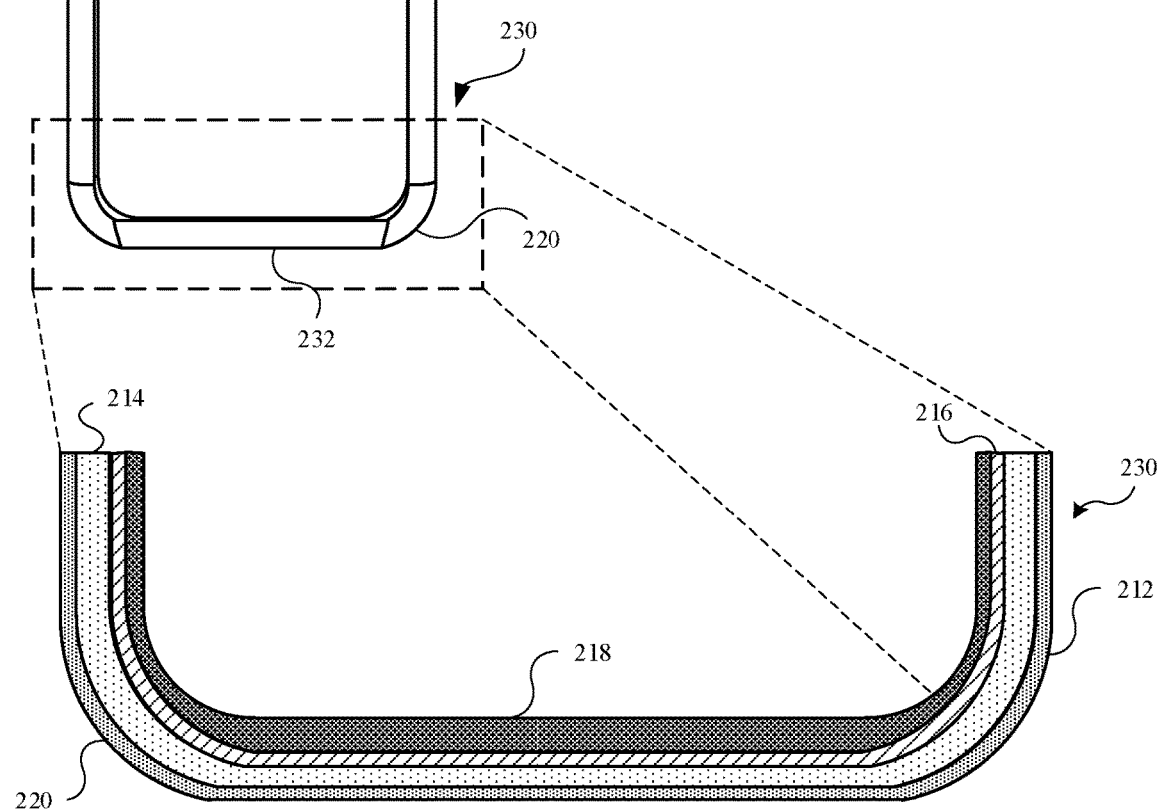

FIGS. 2A-2B illustrate various views of an exemplary case for a portable electronic device, in accordance with some embodiments. FIG. 2A illustrates a perspective view of a case 200 that is capable of carrying the portable electronic device 100. The case 200 includes walls 210 that define a cavity 202 that is capable of carrying the portable electronic device 100 therein. The walls 210 are arranged to define corner portions 220 that wrap around the corresponding corners of the portable electronic device 100. In particular, it should be noted that during a drop event, the corners of the portable electronic device 100 are more likely to absorb a greater amount of the impact than other portions of the portable electronic device 100. As a result, the corner portions 220 of the case 200 may include a greater concentration and/or greater amount of damping particles than other portions of the case 200.

FIG. 2B illustrates a cross-sectional view of a bottom portion 230 of the case 200, as shown in FIG. 2A. The bottom portion 230 of the case 200 may include the corner portions 220 as well as a bottom planar wall 232. As shown in FIG. 2B, the wall 210 of the bottom portion 230 is comprised of multiple layers that are overlaid and arranged in a stackup. For example, FIG. 2B illustrates that the wall 210 includes a passive layer 212, an active damping layer 214, a stimulation layer 216, and a cosmetic layer 218.

The passive layer 212 provides a static amount of damping for the portable electronic device 100. In some examples, the passive layer 212 includes leather, silicone, polymers, and the like. The passive layer 212 may protect internal layers—e.g., the active damping layer 214, the stimulation layer 216, etc.—from the external environment. Beneficially, the passive layer 212 may prolong the life of these internal layers. The wall 210 and any one of the passive layer 212, the active damping layer 214, the stimulation layer 216, or the cosmetic layer 218 are of any shape and/or thickness necessary to protect the portable electronic device 100.

The active damping layer 214 is comprised of an active electro-mechanical material, such as magnetorheological elastomers (MREs), magnetorheological fluids (MRFs) or electro-active polymers (EAPs). The active electro-mechanical material may be activated by an external stimuli, such as an electrical conductive field or a magnetic field. Other external stimuli include stress, temperature, moisture, and the like. The active electro-mechanical material is characterized as having material properties that are capable of undergoing changes when exposed to the influence of the external stimuli. In this manner, the active damping layer 214 may impart a variable amount of stiffness and/or viscosity. In some examples, once the external stimuli is applied to the active damping layer 214, the active electro-mechanical material may undergo a change of material properties in a matter of a few milliseconds.

In some embodiments, the active damping layer 214 includes an MRE. The MRE includes magnetic particles that are suspended and arranged in a matrix. The matrix that makes up the active damping layer 214 may be considered active and can be molded using compression molding into any specific geometry, thickness, and/or cross-section. The matrix may be a viscous fluid or an elastomer matrix or a gel. In some examples, an elastomer matrix may be desirable because rubbers are generally soft and deformable. In some examples, MREs or MRFs may be desirable over EAPs because unlike EAPs, the MREs or MRFs do not alter their shape and/or size when exposed to the external stimuli. Beneficially, the walls 210 of the case 200 are more likely to hold their shape and/or size over a period of prolonged usage.

When the active damping layer 214 is in a free (i.e., unstimulated configuration), the magnetic particles may be randomly distributed throughout the matrix. However, when the active damping layer 214 is exposed to a magnetic field generated by the stimulation layer 216, the magnetic particles may become polarized and form chain-like clusters that are magnetically aligned with magnetic field lines associated with the magnetic field. For example, during the stimulated configuration (i.e., when the active damping layer 214 is exposed to the magnetic field), the magnetic particles may be aligned generally parallel to each other. Furthermore, the magnetic field may also alter the distribution of the magnetic particles throughout the matrix.

In order to separate the magnetic particles, the stimulation layer 216 may suspend exposing the active damping layer 214 to the magnetic field. When the active damping layer 214 is exposed to the external magnetic field, the elastic modulus of the matrix may alter according to the strength of the magnetic field and its direction. In some examples, when the active damping layer 214 is a gel or fluid, the viscosity of the gel or fluid may be altered. In some examples, when the active damping layer 214 is an elastomer, the hardness/stiffness of the elastomer may be altered. In some examples, the magnetic particles are comprised of alloys (e.g., nickel, cobalt, etc.), ceramics, and/or "rare earth" magnets (e.g., neodymium, etc.). In some examples, the magnetic particles are micron-sized.

In some embodiments, the active damping layer 214 includes an EAP. The EAP includes polymers that are capable of exhibiting a change in shape and/or size when exposed to an external electrical field, such as an electrical current. In some examples, the polymers include dielectric polymers or ionic polymers. When the active damping layer 214 is in the unstimulated configuration, the polymers may be characterized as having an initial shape. However, when the active damping layer 214 is exposed to the electrical field generated by the stimulation layer 216, the polymers may undergo a change in shape and/or size. By altering a shape and/or size of the polymers of the active damping layer 214, the active damping layer 214 may undergo a change in stiffness. As described herein, "stiffness" may be referred to as the extent by which an object resists deformation in response to an applied force. For example, when the polymers increase in size as a result of expose to the electrical field, the active damping layer 214 becomes stiffer. Conversely, when the polymers decrease, the active damping layer 214 becomes less stiff.

The stimulation layer 216 may include a magnetic element capable of generating a magnetic field. The stimulation layer 216 may also include electrodes capable of generating an electrical current. In some embodiments, the stimulation layer 216 is electrically coupled to a controller and/or processor of the case 200 by way of a circuit or flexible cable.

The cosmetic layer 218 may be optional. The cosmetic layer 218 may be comprised of a material that is similar and/or identical to the passive layer 212, and may be utilized to impart a consistency of cosmetic appearance throughout the visible portions of the case 200. For example, only the cosmetic layer 218 and the passive layer 212 of the walls 210 may be visible to a user. Therefore, the cosmetic layer 218 may be constructed with material(s), design(s), and/or color(s) that are considered aesthetically pleasing to a user.

FIGS. 3A-3B illustrate various views of an exemplary case for a portable electronic device, in accordance with some embodiments. FIG. 3A illustrates a cross-sectional view of a bottom portion 330 of a case 300. In particular, FIG. 3A illustrates that the walls 310 of the bottom portion 330 of the case 300 include barriers 340 to prevent magnetic particles 350 from passing between different sections of the case 300. In contrast, the case 200 as illustrated in FIGS. 2A-2B does not include barriers 340 that separate different sections of the active damping layer 214.

As shown in FIG. 3A, the walls 310 of the bottom portion 330 include a stackup of different layers that impart active damping protection for a portable electronic device—e.g., the portable electronic device 100. The walls 310 include a passive layer 312, an active damping layer 314, a stimulation layer 316, and a cosmetic layer 318. Different sections of the active damping layer 314 may be separated by the barriers 340. For example, a corner section 342-C of the active damping layer 314 may be separated by the barriers 340 from the bottom section 342-B and the side section 342-D. The corner section 342-C may include a second concentration ($R_2$) of magnetic particles 350 that is greater than a first concentration ($R_1$) of magnetic particles 350 included within the bottom section 342-B. In some examples, a greater concentration and/or number of magnetic particles 350 within the corner section 342-C may be more beneficial to protecting the portable electronic device 100—especially, as the corners of the portable electronic device 100 may be more susceptible to absorbing the initial impact and/or a greater amount of impact associated with the drop event. Alternatively, the corner section 342-C may include fewer magnetic particles 350 than the bottom section 342-B.

FIG. 3B illustrates that the barriers 340 prevent the magnetic particles 350 within a section—e.g., the corner section 342-A—from mixing with a fixed amount of magnetic particles 350 that are included within the bottom section 342-B. Beneficially, this maintains a minimum number of magnetic particles 350 within each section of the case 300. In some embodiments, the minimum number of magnetic particles 350 within each section of the case 300 may be established by the manufacturer designing and product testing of various, specific device configurations. For example, during product testing, the manufacturer may identify which portions of the portable electronic device 100 are more susceptible to experiencing the greatest amount of force during an impact. As a result, the manufacturer may design a specific device configuration that establishes a greater number/concentration of magnetic particles 350 in those identified sections of the case 300.

FIGS. 4A-4B illustrate exemplary sequence diagrams of a cross-sectional view of a case for a portable electronic device, in accordance with some embodiments. FIG. 4A illustrates a cross-sectional view of a case 410—e.g., the case 200—while the case 410 is in a free configuration 400-A. As defined herein, the case 410 is in the free configuration 400-A when the case 410 is not exposed to a stimulation field and/or when the case 410 is exposed to a stimulation field and the stimulation field is of insufficient magnitude to generally alter an arrangement of magnetic particles 450 interspersed within a matrix 452.

In particular, FIG. 4A illustrates that the case 410 includes a stackup of layers that includes a stimulation layer 412, an active damping layer 414, and a passive layer 416. The active damping layer 414 may refer to a magnetosensitive layer that includes magnetic particles 450 that are interspersed within the matrix 452. In the free configuration, the magnetic particles 450 may be randomly distributed throughout the matrix 452. The matrix 452 may include a gel/fluid or elastomer. The active damping layer 414 may supplement and/or substitute for any damping protection provided by the passive layer 416.

In some embodiments, the case 410 is capable of establishing a protective system with a portable electronic device—e.g., the portable electronic device 100. In particular, the case 410 may receive instructions from the portable electronic device 100 for the purpose of protecting the portable electronic device 100. For example, the case 410 is capable of receiving and/or transmitting data signals from a processor (not illustrated) of the portable electronic device 100 in a wired and/or wireless manner. In some embodiments, the case 410 is physically charged by using short-wavelength UHF radio waves (e.g., Bluetooth, etc.) or wireless-inductive charging from the portable electronic device 100. Moreover, the case 410 may wirelessly receive data signals from the processor of the portable electronic device 100 via at least one of short-wavelength radio waves, electromagnetic induction (e.g., RFID), local wireless area networking (WAN), and the like. The case 410 may include a circuit capable of receiving data signals from the portable electronic device 100, receiving power from the portable electronic device 100, and adjusting the damping protection provided by the active damping layer 414.

The portable electronic device 100 may include a sensor (e.g., an accelerometer, gyroscope, etc.) that is capable of determining at least one drop characteristic during a drop event, a fall, and/or an impact. The drop characteristic may include at least one of an orientation (e.g., X-axis, Y-axis, Z-axis, etc.), a position, a momentum/velocity, an acceleration of the portable electronic device 100, or a prediction of portion(s) of the portable electronic device 100 most likely to be exposed to the greatest amount of force during the impact. In some embodiments, based on the at least one drop characteristic, the portable electronic device 100 may be able to determine portion(s) of the portable electronic device 100 that are predicted to first strike a physical object (e.g., a table, etc.). The prediction may be based on at least one of a mass of the portable electronic device 100, a center of gravity of the portable electronic device 100, or dimensions of the portable electronic device 100, which may be known to the portable electronic device 100. As a result, the portable electronic device 100 can determine which portion(s) of the portable electronic device 100 should be protected from the impact during the drop event. Thereafter, the processor may transmit data signals to the controller of the case 410 that include the at least one drop characteristic and/or the prediction. Beneficially, the synergy between the case 410 and the portable electronic device 100 may provide protective advantages that are not capable of being imparted by a case alone.

After receiving the at least one drop characteristic, the controller of the case 410 may be capable of determining which section(s) of the case 410 should be activated in order to protect corresponding portion(s) of the portable electronic device 100 predicted to suffer the greatest amount of impact. For example, the controller may determine that section(s) of the active damping layer 414 corresponding to the corner portions 220 (as illustrated in FIGS. 2A-2B) should only be activated relative to other section(s) of the active damping layer 414. In particular, the controller of the case 410 may selectively stimulate select magnetic field generators of the stimulation layer 412 in order to provide localized stimulation of the active damping layer 414 corresponding to the corner portions 220. As a result, only magnetic particles 450 and the matrix 452 of the corner portions 220 of the active damping layer 414 are magnetized by the external magnetic field. As shown in FIG. 4B, the resulting magnetic field alters the viscosity or stiffness of the matrix 452 by affecting the distribution of the magnetic particles 450 within the matrix 452. The magnetic particles 450 may be arranged as chainlike clusters or columns and oriented in a similar orientation to the magnetic field lines of the external magnetic field. By altering the distribution of magnetic particles 450 within the matrix 452, the viscosity of the fluid/gel or the stiffness of the elastomer is also altered.

Although the active damping layer 414 is illustrated in FIGS. 4A-4B as including MREs, MRFs, and the like, it should also be noted that the active damping layer 414 may include an EAP. In some examples, the controller of the case 410 may alter the shape and/or size of the EAP based on the at least one drop characteristic. By altering the shape and/or size of the EAP, the active damping layer 414 can alter the stiffness of localized sections of the active damping layer 414 that correspond to portion(s) of the portable electronic device 100 most susceptible and/or predicted to suffer the greatest amount of impact. In some embodiments, the stimulation layer 412 includes electrodes capable of generating an electrical field to alter the shape and/or size of the active damping layer 414. The magnetorheological layer may also be referred to as a magnetosensitive layer due to the sensitivity of the magnetic particles to an external magnetic field.

In some embodiments, the external magnetic field and the electrical field may be continually tuned and variably adjusted by the stimulation layer 412 to account for different momentum/velocity values during a drop event. For example, during a drop event, the portable electronic device 100 may increase in velocity. The controller of the case 410 may adjust the strength of the stimulation field during the drop event as needed to sufficiently protect the portable electronic device 100. Additionally, the controller may also selectively activate a set of electrodes or magnets in accordance with a change in orientation of the portable electronic device 100 during the drop event.

Beneficially, localized stimulation of section(s) of the active damping layer 414 reduces power consumption by the case 410. In some embodiments, the controller may cause multiple sections of the active damping layer 414 to be activated concurrently, simultaneously, or in a sequential manner. In some embodiments, the controller may cause the entire active damping layer 414 to be activated.

Additionally, the case 410 is capable of altering a perceived feel (e.g., rigidity, softness, etc.) in the absence of a drop event. In some embodiments, the controller of the case 410 may alter the viscosity or stiffness of the active damping layer 414 in order to alter the manner in which the user perceives the case 410. For example, the controller of the case 410 may increase the stiffness of the active damping layer 414 in order to create the perception of a case formed of a hard plastic. In another example, the controller of the case 410 may decrease the hardness of the active damping layer 414 to create the perception of a case formed of leather. According to some embodiments, the concentration and/or amount of magnetic particles 450 within the active damping layer 414 is established to provide a predetermined amount of stiffness as perceived by the user.

In addition to the implementation of active electro-mechanical materials in a case, other embodiments of the active electro-mechanical materials can be implemented in a seal for operational components.

Figures 5, 6:
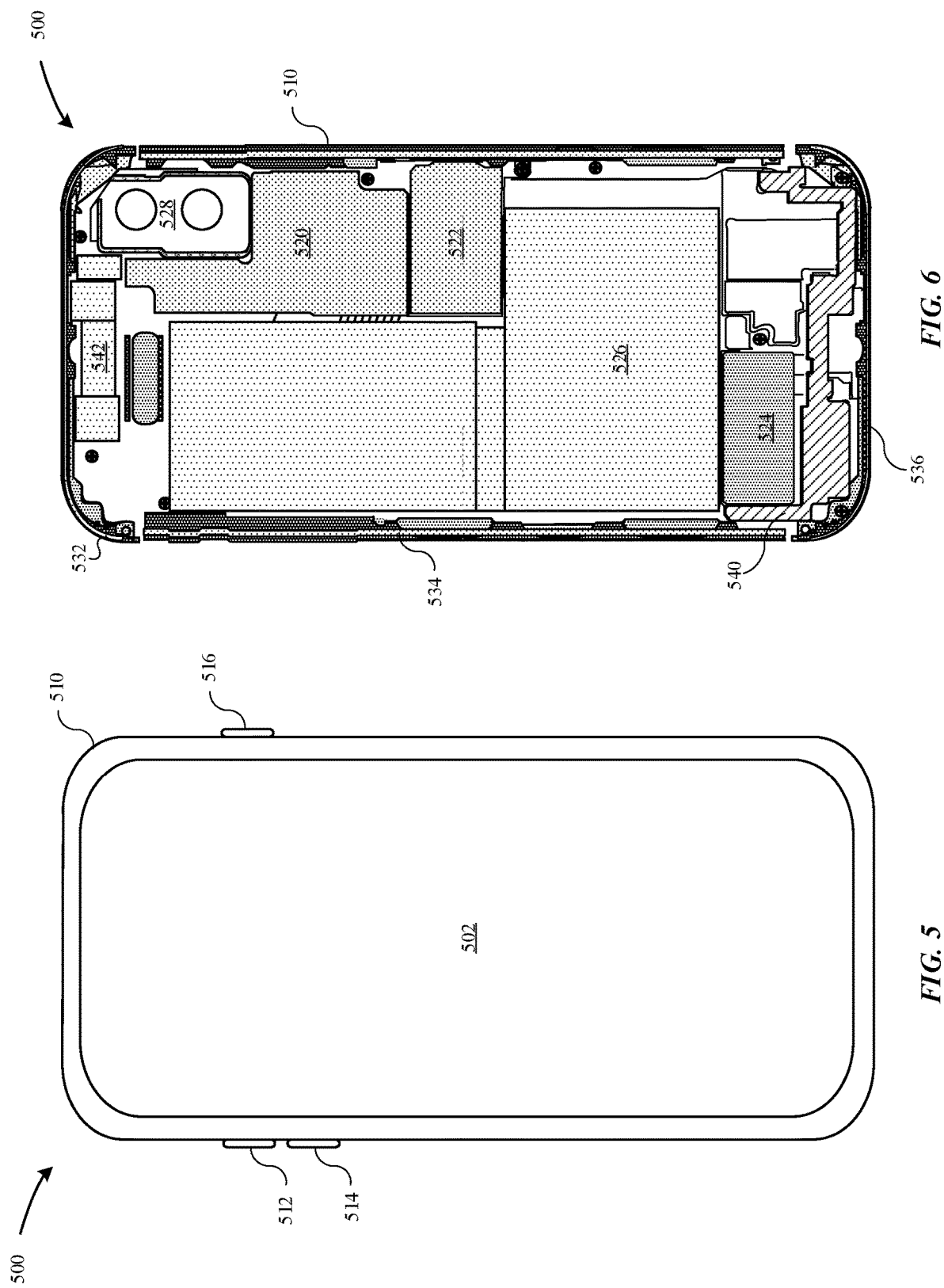
FIGS. 5-6 illustrate exemplary portable electronic devices that include active electro-mechanical materials for protecting the portable electronic devices, in accordance with some embodiments.

FIGS. 5-6 illustrate various views of a portable electronic device that includes at least one protective seal for protecting the portable electronic device, in accordance with some embodiments. FIG. 5 illustrates a top view of a portable electronic device 500, such as a smartphone, a tablet, a laptop, or a portable computing device. The portable electronic device 500 includes a housing 510 that is capable of carrying one or more electronic components (e.g., a display, a processor, a PCB, a wireless transceiver, a memory, etc.). The housing 510 further carries rocker switches 512, 514, and a switch 516. The rocker switches 512, 514, and the switch 516 are capable of providing transmitting input signals for executing functions by the one or more electronic components. The housing 510 further carries a display 502 that is capable of presenting visual content. The display 502 may include a liquid crystal display (LCD), an organic light-emitting diode (OLED) display, and the like.

FIG. 6 illustrates a top view of a cutaway of the portable electronic device 500 as shown in FIG. 5. As illustrated in FIG. 6, the portable electronic device 500 includes electronic components, such as a processor 520, a wireless transceiver 522, a haptic feedback module 524, a battery 526, and a camera module 528. Each of these electronic components may be sealed from moisture and air ingress by a seal. In some examples, the seal may also be referred to as a gasket. For example, FIG. 6 illustrates a first side seal 510 that provides moisture sealing for the processor 520, the wireless transceiver 522, and the battery 526. In particular, the first side seal 510 may be affixed to walls of the housing 510 and situated around the processor 520, the wireless transceiver 522, and the battery 526. FIG. 6 further illustrates a second side seal 534 that is affixed to the walls of the housing 510 and prevents and/or minimizes moisture from reaching the battery 526. Furthermore, FIG. 6 illustrates a bottom seal 536 that seals the haptic feedback module 524 from moisture ingress. A top seal 532 prevents and/or minimizes moisture ingress into the camera module 528.

In some embodiments, the seals may be of any geometry and suitable thickness to prevent moisture from passing through the walls of the housing 510 to reach the electronic components. The electronic components may be electrically coupled to switches, e.g., the switch 516 by way of a flexible cable 540. It should be noted that the seals do not affect the mating between the switches and the electronic components.

According to some embodiments, some of the electronic components—e.g., the processor 520, the wireless transceiver 522, the haptic feedback module 524, the battery 526, or the camera module 528 may be more susceptible than other electronic components to being damaged when the portable electronic device 500 is exposed to shock from an impact. In particular, a load path may extend between an external structure (e.g., trim structure, etc.) disposed along an external surface of the housing 510 and one of the electronic components. Thereafter, when the external structure is subject to an impact, a load associated with the impact travels via the load path towards the electronic component. Consequently, the electronic component may be damaged. However, the seals—e.g., the first seal 510—may utilize active damping materials (e.g., active electro-mechanical materials, etc.) to redirect the load from the load path and away from the electronic component. In particular, the seal may utilize the active damping mechanism to redirect the load away from the electronic component and instead towards stiff structures that are less vital to the function of the portable electronic device 500. In contrast, conventional portable electronic devices rely upon either redirecting the load away from the electronic component or increasing the stiffness of the electronic component in order to survive the impact.

FIG. 6 further illustrates that the portable electronic device 500 includes a sensor 542. The sensor 542 may include at least one of an accelerometer, a gyroscope, an internal compass, a proximity sensor, and the like. The sensor 542 is electrically coupled to the processor 520 via a flexible cable or printed circuit. During a drop event and prior to the portable electronic device 500 suffering an impact, the processor 520 is capable of determining at least one drop characteristic. The drop characteristic may include at least one of an orientation (e.g., X-axis, Y-axis, Z-axis, etc.), a position, a momentum/velocity, an acceleration of the portable electronic device 500, or a prediction of portion(s) of the portable electronic device 500 most likely to be exposed to the greatest amount of impact. The prediction may be based on at least one of a mass of the portable electronic device 500, a center of gravity of the portable electronic device 500, or dimensions of the portable electronic device 500, which may be established within a memory of the portable electronic device 500.

Furthermore, based on the at least one drop characteristic, the processor 520 is capable of determining an electronic component(s) that is most susceptible to being damaged by the impact. For example, the processor 520 may be capable of determining that a corner portion of the housing 510 in proximity to the camera module 528 will strike the floor with the greatest amount of force. Accordingly, the processor 520 may determine one or more seals—e.g., the first seal 510— in proximity to the camera module 528 that should be activated. In some examples, the seal(s) to be activated are disposed along the load path. In response, the processor 520 is capable of stimulating an active damping core of the seal such as to adjust a damping coefficient of the seal. According to some examples, each of the seals may include a stimulation layer for activating the active damping core. Beneficially, the seal may redirect the load away from the electronic component(s) and instead towards sacrificial components (e.g., brackets, etc.).

Figure 7A:
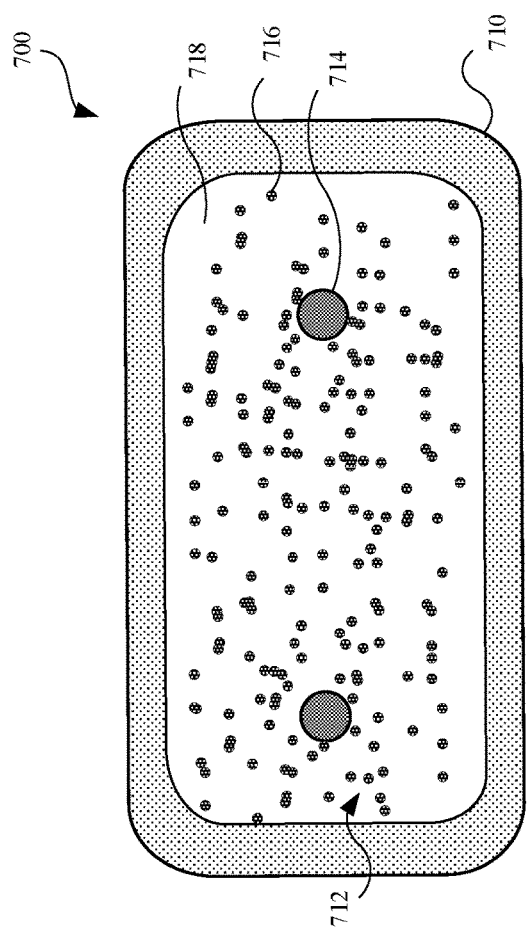
FIGS. 7A-7B illustrate exemplary protective seals for protecting portable electronic devices, in accordance with some embodiments.
Figure 7B:
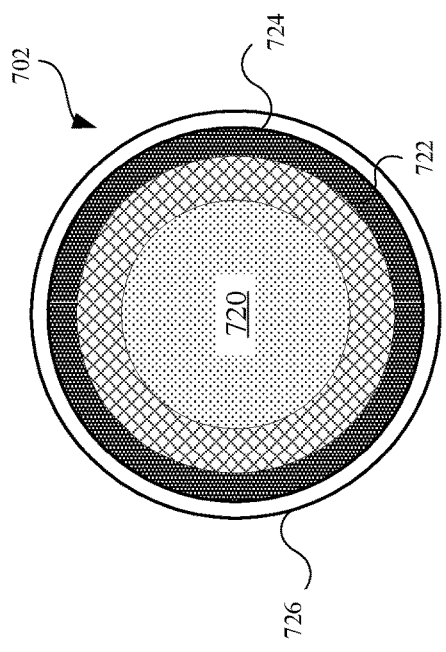

FIGS. 7A-7B illustrate exemplary protective seals for protecting portable electronic devices, in accordance with some embodiments. FIG. 7A illustrates a cross-sectional view of a seal 700, in accordance with some embodiments. The seal 700 includes an active damping core 712 having a magnetorheological core or an electro-active polymer core. The matrix 718 that makes up the active damping core 712 may be considered active and can be molded using compression molding into any specific geometry, thickness, and/or cross-section. The seal 700 further includes a stimulation circuit 714 that is capable of generating a stimulation field, such as a magnetic field or an electrical field. The seal 700 further includes a passive conductive sheath 710 that overlays the active damping core 712. The passive conductive sheath 710 may be nickel coated/plated or silver coated/plated to provide a ground path. Beneficially, the use of the passive conductive sheath 710 overrides the need to add an additional conductive layer to the seal 700.

In some examples, the magnetorheological core includes magnetic particles 716 that are interspersed within the matrix 718. In some examples, the stimulation circuit 714 includes a set of lead or copper wires that run along the active damping core 712 and are connected to a power supply. In some examples, the current in the wires will generate a magnetic field that will align the magnetic particles 716 within the matrix 718 to create a predetermined damping state. The magnetorheological core may also be referred to as a magnetosensitive core due to the sensitivity of the magnetic particles to an external magnetic field.

In some examples, the electro-active polymer is capable of altering its shape and/or size. The stimulation circuit 714 includes electrodes that are connected to a power supply. The stimulation circuit is capable of generating an electrical field that alters the shape and/or size of the matrix 718 to create a predetermined damping state. The electro-active polymer may be referred to as an electrosensitive core due to its sensitivity to the external electrical field.

In some embodiments, the active damping core 712 is capable of establishing a variable damping coefficient as a function of frequency, time, magnetic field, and/or electrical current. The active damping core 712 may be controlled by the processor 520 of the portable electronic device 500 to establish a specific damping state during a drop event.

FIG. 7B illustrates a cross-sectional view of a protective seal 702, in accordance with some embodiments. In contrast to the seal 700, the protective seal 702 is characterized as having a circular cross-section. However, it should be noted that the seals may be of any shape as necessary to protect various operational components (e.g., PCBs, displays, switches, etc.). The protective seal 702 includes an active damping core 720. The active damping core 720 is overlaid by a stimulation layer 722. The stimulation layer 722 is overlaid by a capacitive rubber layer 724. In some embodiments, the protective seal 702 may further include a passive conductive sheath 726 to provide grounding.

According to some embodiments, when the protective seal 702 is in a free configuration, the protective seal 702 may be characterized as being rigid and stiff. Beneficially, the rigid nature of the protective seal 702 can be used to establish accurate datum schemes to determine precise dimensions (e.g., X-axis, Y-axis, etc.) for moisture and air sealing of electronic components. Furthermore, the rigid nature of the protective seal 702 can provide structural stiffness for the portable electronic device 500 while in the free configuration. As described herein, the protective seal 702 is in the free configuration when the active damping core 712 is not exposed to a stimulation field and/or when the active damping core 712 is exposed to a stimulation field that is of insufficient magnitude to generally alter a shape and/or size of the active damping core 712.

According to some embodiments, the protective seal 702 is capable of providing damping protection simultaneously with structural stiffness while the protective seal 702 is in the stimulated configuration. During the stimulated configuration (i.e., when the active damping core 712 is exposed to the magnetic field), the damping coefficient of the protective seal 702 is altered such that load associated with a drop event is redirected away from the load path that leads towards an electronic component.

Figure 8:
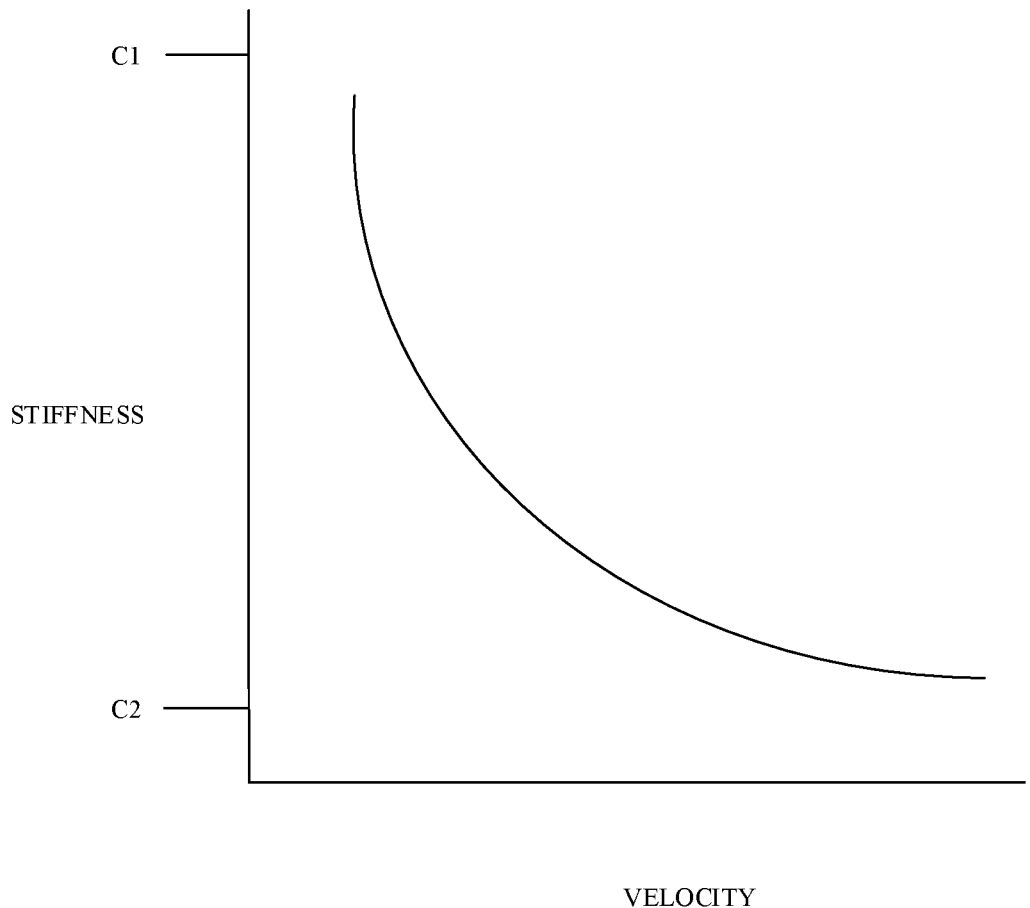
FIG. 8 illustrates an exemplary graph indicating a relationship between stiffness with respect to velocity, in accordance with some embodiments.

FIG. 8 illustrates an exemplary graph indicating a relationship between stiffness and viscosity with respect to velocity, in accordance with some embodiments. FIG. 8 illustrates a graph indicating a relationship between velocity of a portable electronic device—e.g., the portable electronic device 100—and stiffness of a case—e.g., the case 150—during a drop event. In particular, FIG. 8 illustrates that an increase in velocity of the portable electronic device 100 requires a reduction in the amount of stiffness of the case 150 that is required to sufficiently protect the portable electronic device 100 from damage. Additionally, FIG. 8 may also illustrate that an increase in velocity of the portable electronic device 500 requires a reduction in the amount of stiffness of a protective seal—e.g., the seal 700—that is required to sufficiently protect the portable electronic device 500 from damage.

Figure 9:
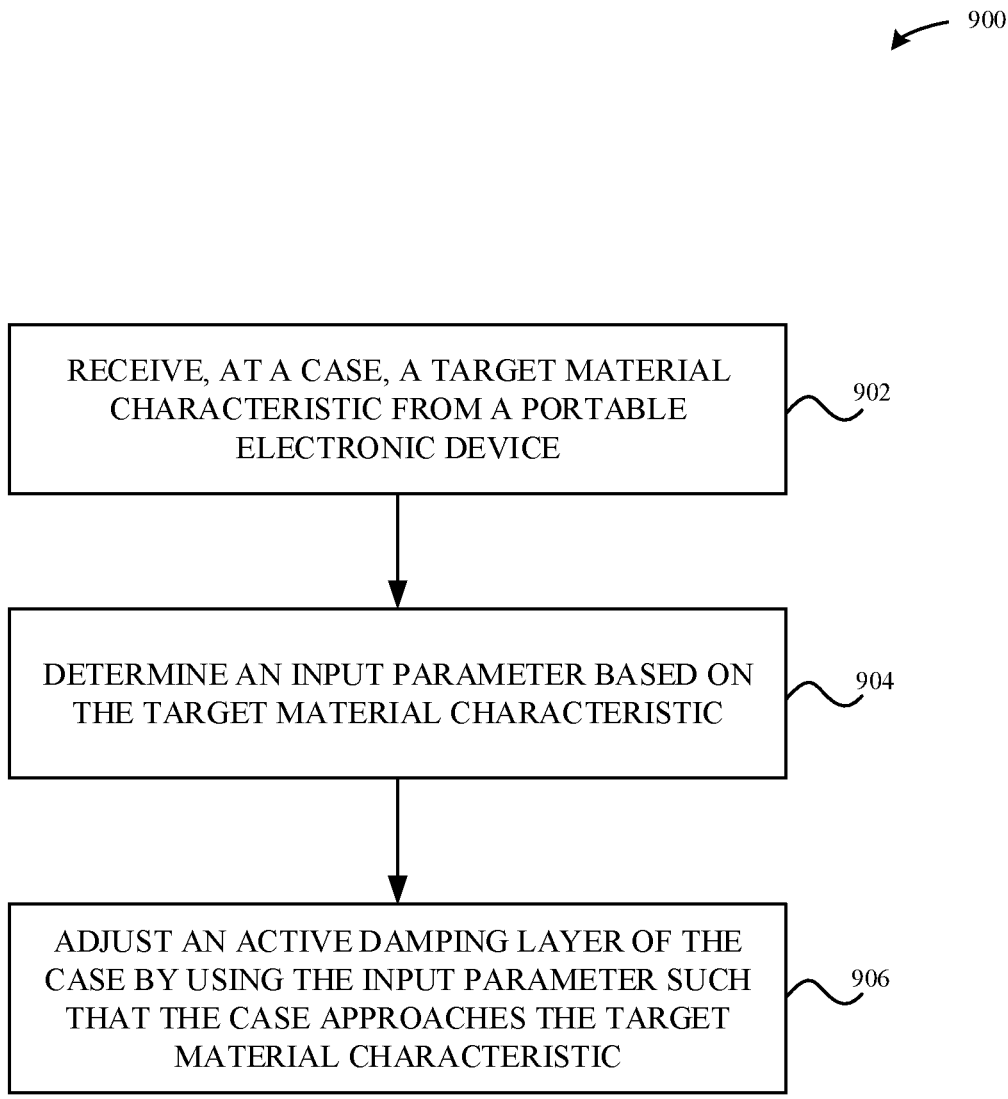
FIG. 9 illustrates a flowchart of a method for adjusting a material characteristic of a case for a portable electronic device, in accordance with some embodiments.

FIG. 9 illustrates a flowchart of a method for adjusting a material characteristic of a case for a portable electronic device, in accordance with some embodiments. The method 900 starts at step 902, where a controller for a case—e.g., the case 410—receives a target material characteristic from a portable electronic device 100. The case 410 may be capable of carrying the portable electronic device 100. According to some examples, the target material characteristic refers to a desired perception of a material, such as leather, plastic, carbon fiber, and the like.

At step 904, the controller may determine an input parameter based on the target material characteristic. The input parameter may include at least one of a frequency, time, magnitude of magnetic field, or magnitude of electrical current generated by the stimulation layer 412.

At step 906, the controller may adjust the stiffness coefficient of the active damping layer 414 by using the input parameter. The stimulation layer 412 may provide localized or global stimulation of the active damping layer 414 in order to establish a variable stiffness coefficient such that the case 410 approaches the target material characteristic.

Figure 10:
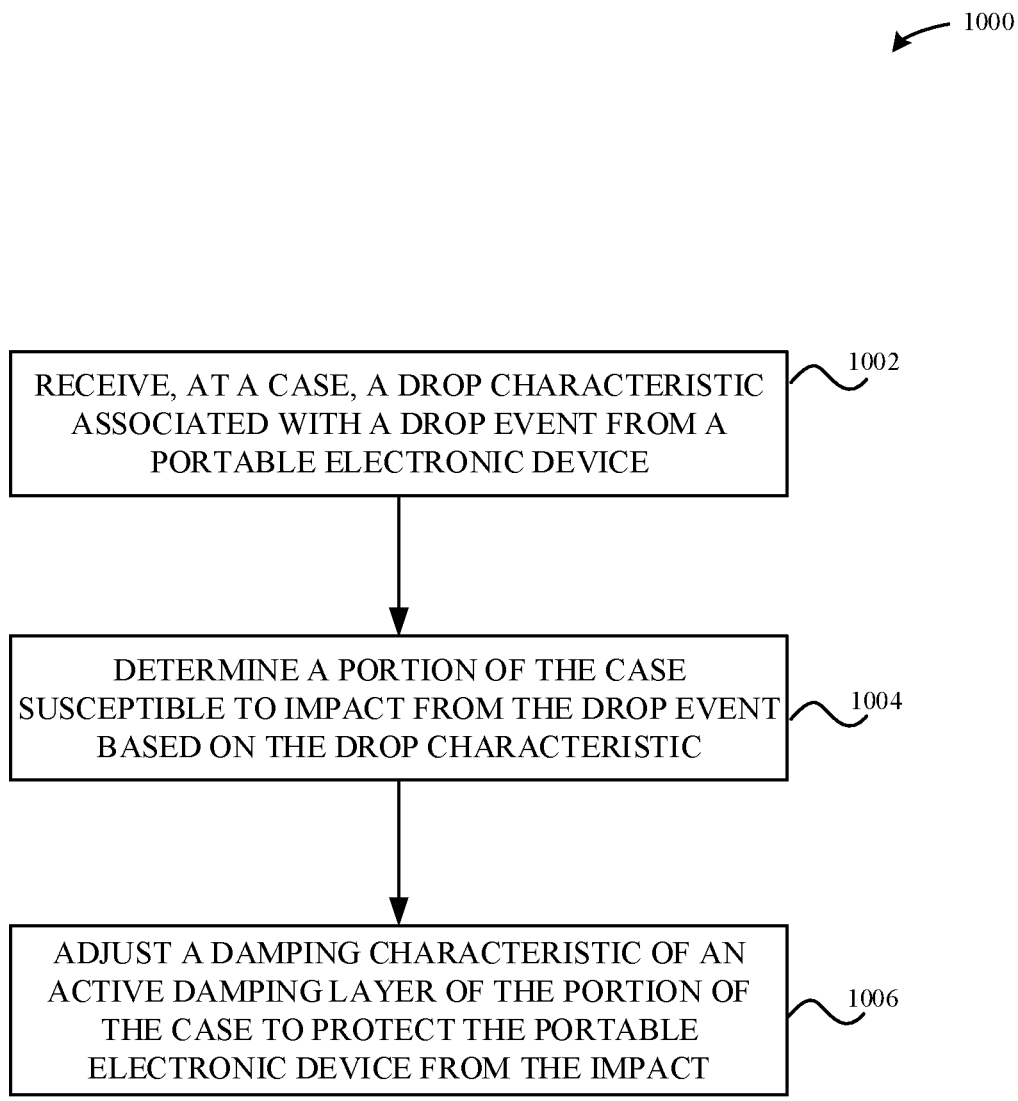
FIG. 10 illustrates a flowchart of a method for adjusting a damping characteristic of a case for a portable electronic device, in accordance with some embodiments.

FIG. 10 illustrates a flowchart of a method for adjusting a damping characteristic of a case for a portable electronic device, in accordance with some embodiments. The method 1000 begins at step 1002 where a case—e.g., the case 410—receives a drop characteristic from a portable electronic device—e.g., the portable electronic device 100—while the portable electronic device 100 experiences a fall during a drop event.

The drop characteristic may include at least one of an orientation (e.g., X-axis, Y-axis, and Z-axis, etc.), a position, a momentum/velocity, an acceleration of the portable electronic device 100, or a prediction of portion(s) of the portable electronic device 100 most likely to be exposed to the greatest amount of impact.

At step 1004, the controller of the case 410 determines a portion of the case 410 that is susceptible to absorbing impact or predicted to receive the brunt of the impact associated with the drop event based on the drop characteristic. In some embodiments, the portable electronic device 100 may be able to determine portion(s) of the portable electronic device 100 that are predicted to first strike a physical object (e.g., a table, etc.).

At step 1006, the controller of the case 410 may adjust a damping characteristic of the active damping layer 414 of a selected section of the case 410 in order to protect the selected section of the case 410 from impact associated with the drop event. In some embodiments, the damping characteristic is particular to a specific model of the portable electronic device 100.

Figure 11:
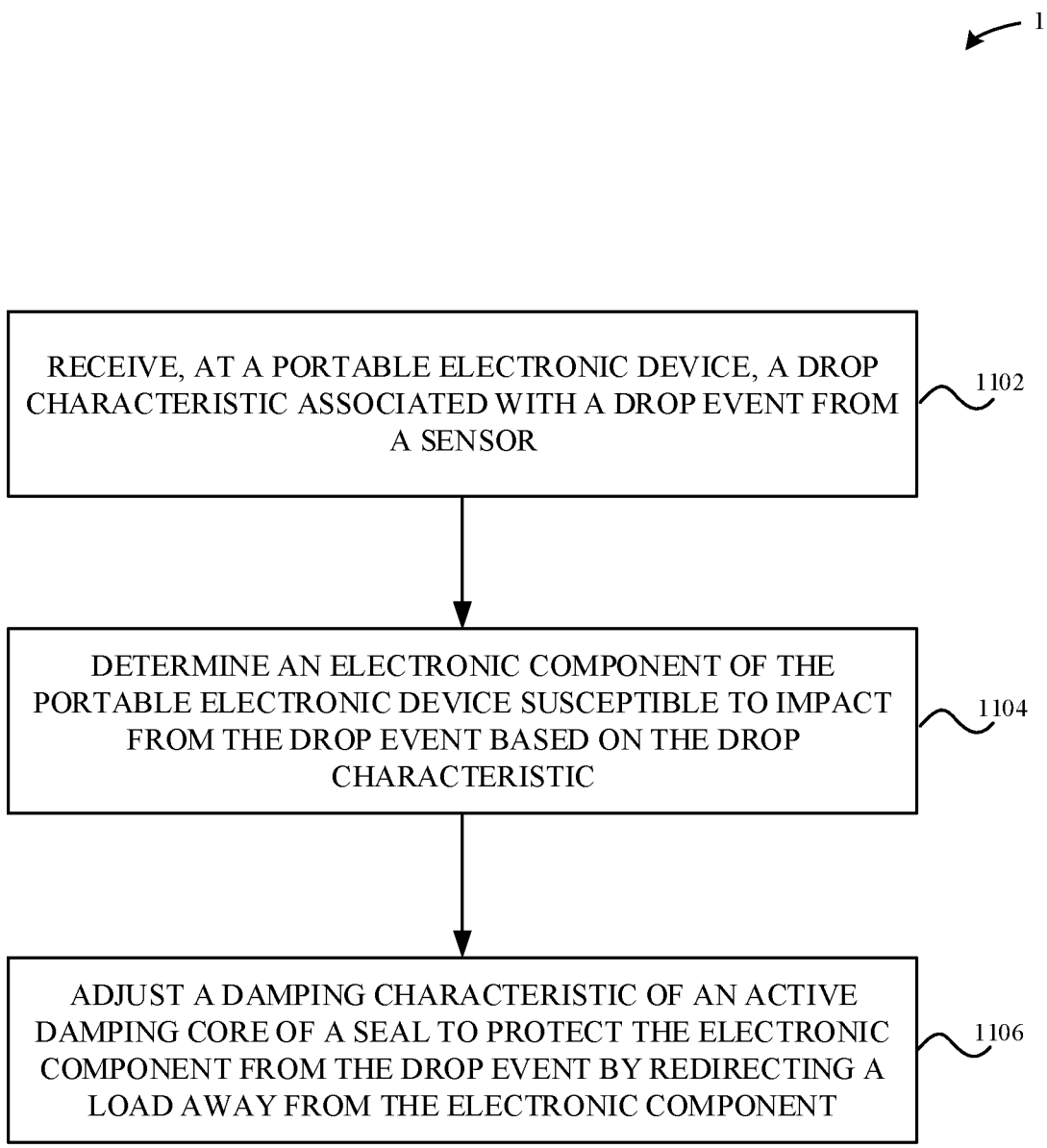
FIG. 11 illustrates a flowchart of a method for establishing a damping characteristic of a protective seal for a portable electronic device, in accordance with some embodiments.

FIG. 11 illustrates a flowchart of a method for adjusting a damping characteristic of a protective seal for a portable electronic device, in accordance with some embodiments. The method 1100 begins at step 1102 where a processor of a portable electronic device—e.g., the portable electronic device 500—receives a drop characteristic associated with a drop event from a sensor. The sensor may include at least one of an accelerometer, a gyroscope, a proximity sensor, and the like.

At step 1104, based on the drop characteristic, the processor may determine an electronic component of the portable electronic device 500 that is susceptible to impact from the drop event. In some examples, a load path may be defined between the electronic component—e.g., the processor 520—and the housing 510 of the portable electronic device 500. In some embodiments, the processor may also determine a portion of the portable electronic device 500 that is susceptible to impact, and then subsequently determine the electronic component susceptible to impact.

At step 1106, the processor may adjust a damping characteristic of an active damping core—e.g., the active damping core 712 of a seal 700—in order to redirect the load associated with the drop event away from the electronic component. According to some embodiments, the processor may decrease the stiffness of the active damping core 712 such as to redirect the load path away from the electronic component.

Figure 12:
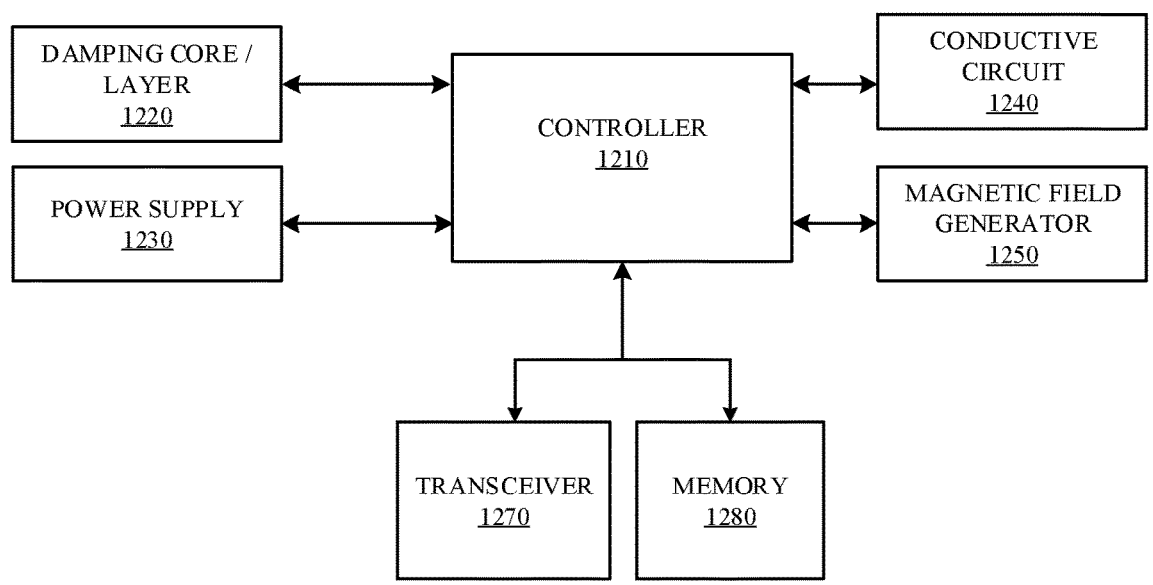
FIG. 12 illustrates a system diagram of at least a case for a portable electronic device that is capable of executing the various techniques described herein, in accordance with some embodiments.

FIG. 12 illustrates a block diagram of a case 1200 configured to implement the various techniques described herein, according to some embodiments. In particular, the detailed view illustrates various operational components that can be included in the case 150 as illustrated in FIG. 1. As shown in FIG. 12, the case 1200 includes a controller 1210 for controlling the overall operation of the case 1200. According to some embodiments, the case 1200 includes a memory 1280 and a power supply 1230.

The case 1200 includes an active damping core/layer 1220 that includes a magnetosensitive layer or an electrosensitive layer. The active damping core/layer 1220 is capable of being stimulated by a conductive circuit 1240 or a magnetic field generator 1250. In some examples, the conductive circuit 1240 and the magnetic field generator 1250 or electrically coupled to the power supply 1230.

Furthermore, the case 1200 includes a transceiver 1270 that is capable of receiving signals from the portable electronic device 100. In some examples, the signals include a drop characteristic and/or a target material characteristic. The transceiver 1270 may include a short-wavelength UHF receiver (e.g., Bluetooth, etc.).

Figure 13:
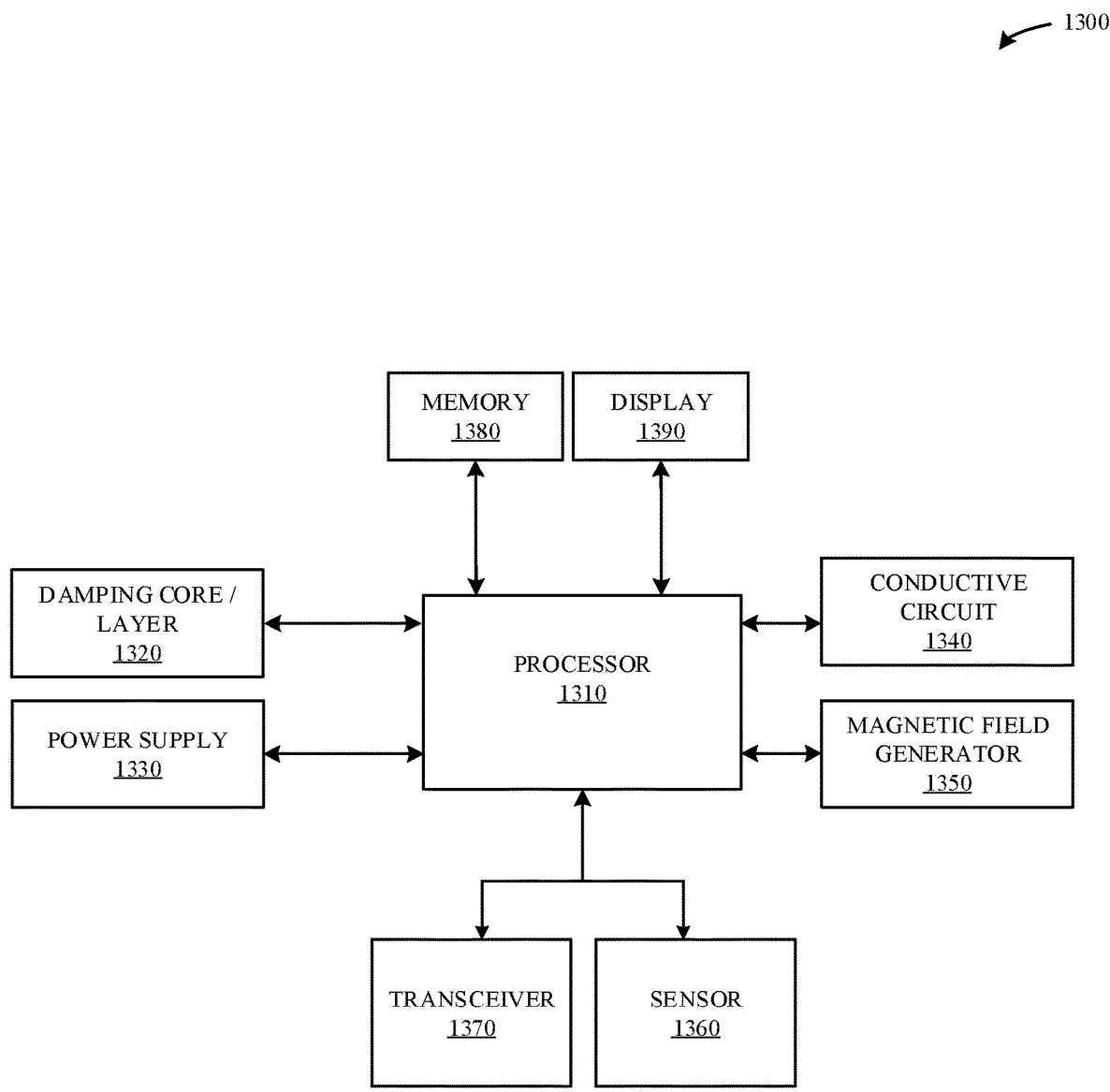
FIG. 13 illustrates a system diagram of a portable electronic device that is capable of executing the various techniques described herein, in accordance with some embodiments.

FIG. 13 illustrates a block diagram of a portable electronic device 1300 configured to implement the various techniques described herein, according to some embodiments. As shown in FIG. 13, the portable electronic device 1300 includes a processor 1310 for controlling the overall operation of the portable electronic device 1300. According to some embodiments, the portable electronic device 1300 includes a power supply 1330 and a memory 1380. The memory 1380 can comprise a single disk or multiple disks (e.g., hard drives), and includes a storage management module that manages one or more partitions within the memory 1380. In some embodiments, the memory 1380 can include flash memory, semiconductor (solid state) memory or the like. The portable electronic device 1300 can also include a Random Access Memory (RAM) and a Read-Only Memory (ROM). The ROM can store programs, utilities or processes to be executed in a non-volatile manner. The RAM can provide volatile data storage, and stores instructions related to the operation of the portable electronic device 1300. According to some examples, the memory 1380 stores a target material characteristic and/or a drop characteristic.

The portable electronic device 1300 further includes an active damping core/layer 1320 that includes a magnetosensitive layer or an electrosensitive layer. The active damping core/layer 1320 is capable of being stimulated by a conductive circuit 1340 or a magnetic field generator 1350. In some examples, the conductive circuit 1340 and the magnetic field generator 1350 are electrically coupled to the power supply 1330.

Furthermore, the portable electronic device 1300 includes a transceiver 1370 that is capable of transmitting data signals to a case—e.g., the case 150. In some examples, the signals include a drop characteristic and/or a target material characteristic. The transceiver 1370 may include a short-wavelength UHF receiver (e.g., Bluetooth, etc.).

In some embodiments, the portable electronic device 1300 includes a sensor 1360. The sensor 1360 is capable of determining at least one of an orientation, a position, a momentum/velocity, an acceleration of the portable electronic device 1300, or a prediction of portion(s) of the portable electronic device 1300 most likely to be exposed to the greatest amount of impact.

The various aspects, embodiments, implementations or features of the described embodiments can be used separately or in any combination. Various aspects of the described embodiments can be implemented by software, hardware or a combination of hardware and software. The described embodiments can also be embodied as computer readable code on a non-transitory computer readable medium. The non-transitory computer readable medium is any data storage device that can store data which can thereafter be read by a computer system. Examples of the non-transitory computer readable medium include read-only memory, random-access memory, CD-ROMs, HDDs, DVDs, magnetic tape, and optical data storage devices. The non-transitory computer readable medium can also be distributed over network-coupled computer systems so that the computer readable code is stored and executed in a distributed fashion.

Any ranges cited herein are inclusive. The terms "substantially", "generally," and "about" used herein are used to describe and account for small fluctuations. For example, they can refer to less than or equal to ±5%, such as less than or equal to ±2%, such as less than or equal to ±1%, such as less than or equal to ±0.5%, such as less than or equal to ±0.1%.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of specific embodiments are presented for purposes of illustration and description. They are not intended to be exhaustive or to limit the described embodiments to the precise forms disclosed. It will be apparent to one of ordinary skill in the art that many modifications and variations are possible in view of the above teachings.

As described above, one aspect of the present technology is the gathering and use of data available from various sources to improve the delivery to users of personal content or any other content that may be of interest to them. The present disclosure contemplates that in some instances, this gathered data may include personal information data that uniquely identifies or can be used to contact or locate a specific person. Such personal information data can include demographic data, location-based data, telephone numbers, email addresses, twitter ID's, home addresses, data or records relating to a user's health or level of fitness (e.g., vital signs measurements, medication information, exercise information), date of birth, or any other identifying or personal information.

The present disclosure recognizes that the use of such personal information data, in the present technology, can be used to the benefit of users. For example, the personal information data can be used to deliver targeted content that is of greater interest to the user. Accordingly, use of such personal information data enables users to calculated control of the delivered content. Further, other uses for personal information data that benefit the user are also contemplated by the present disclosure. For instance, health and fitness data may be used to provide insights into a user's general wellness, or may be used as positive feedback to individuals using technology to pursue wellness goals.

The present disclosure contemplates that the entities responsible for the collection, analysis, disclosure, transfer, storage, or other use of such personal information data will comply with well-established privacy policies and/or privacy practices. In particular, such entities should implement and consistently use privacy policies and practices that are generally recognized as meeting or exceeding industry or governmental requirements for maintaining personal information data private and secure. Such policies should be easily accessible by users, and should be updated as the collection and/or use of data changes. Personal information from users should be collected for legitimate and reasonable uses of the entity and not shared or sold outside of those legitimate uses. Further, such collection/sharing should occur after receiving the informed consent of the users. Additionally, such entities should consider taking any needed steps for safeguarding and securing access to such personal information data and ensuring that others with access to the personal information data adhere to their privacy policies and procedures. Further, such entities can subject themselves to evaluation by third parties to certify their adherence to widely accepted privacy policies and practices. In addition, policies and practices should be adapted for the particular types of personal information data being collected and/or accessed and adapted to applicable laws and standards, including jurisdiction-specific considerations. For instance, in the US, collection of or access to certain health data may be governed by federal and/or state laws, such as the Health Insurance Portability and Accountability Act (HIPAA); whereas health data in other countries may be subject to other regulations and policies and should be handled accordingly. Hence different privacy practices should be maintained for different personal data types in each country.

Despite the foregoing, the present disclosure also contemplates embodiments in which users selectively block the use of, or access to, personal information data. That is, the present disclosure contemplates that hardware and/or software elements can be provided to prevent or block access to such personal information data. For example, in the case of advertisement delivery services, the present technology can be configured to allow users to select to "opt in" or "opt out" of participation in the collection of personal information data during registration for services or anytime thereafter. In addition to providing "opt in" and "opt out" options, the present disclosure contemplates providing notifications relating to the access or use of personal information. For instance, a user may be notified upon downloading an app that their personal information data will be accessed and then reminded again just before personal information data is accessed by the app.

Moreover, it is the intent of the present disclosure that personal information data should be managed and handled in a way to minimize risks of unintentional or unauthorized access or use. Risk can be minimized by limiting the collection of data and deleting data once it is no longer needed. In addition, and when applicable, including in certain health related applications, data de-identification can be used to protect a user's privacy. De-identification may be facilitated, when appropriate, by removing specific identifiers (e.g., date of birth, etc.), controlling the amount or specificity of data stored (e.g., collecting location data a city level rather than at an address level), controlling how data is stored (e.g., aggregating data across users), and/or other methods.

Therefore, although the present disclosure broadly covers use of personal information data to implement one or more various disclosed embodiments, the present disclosure also contemplates that the various embodiments can also be implemented without the need for accessing such personal information data. That is, the various embodiments of the present technology are not rendered inoperable due to the lack of all or a portion of such personal information data. For example, content can be selected and delivered to users by inferring preferences based on non-personal information data or a bare minimum amount of personal information, such as the content being requested by the device associated with a user, other non-personal information available to the content delivery services, or publicly available information.

What is claimed is:

1. A case for a portable electronic device, the case comprising:
    a housing with walls that define a cavity and having a fixed size and shape, the walls carrying: (i) the portable electronic device within the cavity, and (ii) operational components including:
    a processor capable of providing instructions,
    a sensor, in communication with the processor, configured to: (i) generate a drop event signal during a drop event, and (ii) forwarding the drop event signal to the processor that responds by generating a drop event instruction,
    a magnetic circuit, in communication with the processor, provides a drop event magnetic field in response to receipt of the drop event instruction from the processor, and
    a magneto-sensitive layer includes a distribution of magnetic particles responsive to the drop event magnetic field, wherein the distribution of magnetic particles is an ordered distribution in accordance with the drop event magnetic field, such that the housing maintains the fixed size and shape, otherwise, the distribution of magnetic particles is a disordered distribution.

2. The case of claim 1, wherein the magneto-sensitive layer includes a magnetorheological elastomer or a magnetorheological fluid.

3. The case of claim 1, further comprising:
    an external cosmetic layer that overlays the magneto-sensitive layer, wherein the external cosmetic layer includes at least one of a synthetic polymer or leather.

4. The case of claim 1, wherein, in the disordered distribution corresponds to a first stiffness and wherein the ordered distribution corresponds to a second stiffness greater than the first stiffness.

5. The case of claim 1, wherein, in the ordered distribution, the magnetic particles are arranged generally parallel to magnetic field lines associated with the drop event magnetic field.

6. The case of claim 1, wherein the magnetic particles are magnetically polarized subsequent to the magneto-sensitive layer being exposed to the drop event magnetic field.

7. The case of claim 1, wherein the magneto-sensitive layer is characterized as being radio-frequency transparent.

8. A system comprising:
    a portable electronic device comprising:
        a controller configured to (i) determine when the portable electronic device is exposed to a drop event, and (ii) generate a signal that corresponds to the drop event, and
        a transmitter configured to transmit the signal; and
    a case including walls having a fixed size and shape that define a cavity, wherein the portable electronic device is configured to being carried within the cavity, the case comprising:
    a processor configured to (i) receive the signal from the portable electronic device, and (ii) in response, generate instructions corresponding to the signal,
    a conductive circuit configured to generate an electrical field in response to receiving the instructions from the processor, and
    an electro-active polymer layer, wherein when the electro-active polymer is stimulated by the electrical field, the electrical field alters a stiffness characteristic of the electro-active polymer layer while maintaining the size and shape of the housing such as to protect the portable electronic device during the drop event.

9. The system of claim 8, further comprising:
    a cosmetic layer that overlays the electro-active polymer layer, wherein the cosmetic layer includes at least one of a polymer or leather.

10. The system of claim 8, wherein the signal indicates at least 1-degree of freedom of a trajectory of the portable electronic device during the drop event, and the stiffness characteristic is altered according to the at least 1-degree of freedom.

11. The system of claim 10, wherein the electro-active polymer layer includes a first section separated from a second section by a barrier, and the first section includes a first amount of magnetic particles, and the second section includes a second amount of magnetic particles different than the first amount.

12. The system of claim 11, wherein the first amount of magnetic particles in the first section are arranged in a distribution that is different than the second amount of magnetic particles in the second section.

13. A portable electronic device, comprising:
a housing having a fixed size and shape and having walls, the walls configured to carry operational components that include:
an electronic component;
a processor capable of providing instructions;
a sensor configured to (i) determine when the portable electronic device is exposed to a drop event, and (ii) generate a signal in accordance with the drop event; and
a seal that is disposed between at least one of the walls and the electronic component, wherein the seal includes:
a magnetic circuit configured to (i) receive the signal from the sensor, and (ii) in response, generate a magnetic field, and
a magneto-sensitive core that includes magnetic particles distributed throughout a matrix, wherein when the magneto-sensitive core is exposed to the magnetic field, the magnetic field alters the distribution of the magnetic particles within the matrix such as to alter a stiffness of the seal and maintain the fixed size and shape of the housing so as to cause a load associated with the drop event to be redirected away from the electronic component.

14. The portable electronic device of claim 13, wherein the seal further comprises:
a passive conductive sheath that establishes a ground path to the housing.

15. The portable electronic device of claim 13, further comprising:
a power supply, wherein the magnetic circuit is inductively charged by the power supply.

16. The portable electronic device of claim 13, wherein the electronic component includes a battery, a display or a circuit.

17. The portable electronic device of claim 13, wherein, prior to being exposed to the magnetic field, the magnetic particles are randomly distributed throughout the matrix.

18. The portable electronic device of claim 13, wherein, subsequent to the magneto-sensitive core being exposed to the magnetic field, the magnetic particles are arranged generally parallel to magnetic field lines associated with the magnetic field.

19. The portable electronic device of claim 13, wherein the magneto-sensitive core is a magnetorheological elastomer or a magnetorheological fluid.

* * * * *